United States Patent
Van Dal et al.

(10) Patent No.: US 11,677,004 B2
(45) Date of Patent: Jun. 13, 2023

(54) STRAINED CHANNEL FIELD EFFECT TRANSISTOR

(71) Applicant: Taiwan Semiconductor Manufacturing Company, Ltd., Hsin-Chu (TW)

(72) Inventors: Mark Van Dal, Linden (BE); Gerben Doornbos, Leuven (BE); Georgios Vellianitis, Heverlee (BE); Tsung-Lin Lee, Hsinchu (TW); Feng Yuan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 214 days.

(21) Appl. No.: 15/686,716

(22) Filed: Aug. 25, 2017

(65) Prior Publication Data

US 2017/0358648 A1 Dec. 14, 2017

Related U.S. Application Data

(62) Division of application No. 13/161,649, filed on Jun. 16, 2011, now Pat. No. 9,761,666.

(51) Int. Cl.
*H01L 29/10* (2006.01)
*H01L 21/8238* (2006.01)
(Continued)

(52) U.S. Cl.
CPC .. *H01L 29/1054* (2013.01); *H01L 21/823807* (2013.01); *H01L 21/823821* (2013.01);
(Continued)

(58) Field of Classification Search
CPC ....... H01L 21/02532; H01L 21/823807; H01L 21/823814; H01L 21/823821;
(Continued)

(56) References Cited

U.S. PATENT DOCUMENTS

2004/0175872 A1 9/2004 Yeo et al.
2004/0256647 A1 12/2004 Lee et al.
(Continued)

FOREIGN PATENT DOCUMENTS

CN 1770470 5/2006
CN 101189730 5/2008
(Continued)

*Primary Examiner* — Marcos D. Pizarro
(74) *Attorney, Agent, or Firm* — Haynes and Boone, LLP

(57) ABSTRACT

Various strained channel transistors are disclosed herein. An exemplary semiconductor device includes a substrate and a fin structure disposed over the substrate. The fin structure includes a first epitaxial layer disposed on the substrate, a second epitaxial layer disposed on the first epitaxial layer, and a third epitaxial layer disposed on the second epitaxial layer. The second epitaxial layer includes a relaxed transversal stress component and a longitudinal compressive stress component, and the third epitaxial layer has uni-axial strain. A gate structure is disposed on a channel region of the fin structure, such that the gate structure interposes a source region and a drain region of the fin structure.

20 Claims, 19 Drawing Sheets

(51) Int. Cl.
  *H01L 27/092*  (2006.01)
  *H01L 29/66*   (2006.01)
  *H01L 29/78*   (2006.01)
  *H01L 29/165*  (2006.01)
(52) U.S. Cl.
  CPC .... *H01L 27/0924* (2013.01); *H01L 29/66795* (2013.01); *H01L 29/785* (2013.01); *H01L 29/7848* (2013.01); *H01L 29/165* (2013.01)
(58) Field of Classification Search
  CPC .......... H01L 27/0924; H01L 29/66795; H01L 29/785; H01L 29/7848
  See application file for complete search history.

(56) References Cited

U.S. PATENT DOCUMENTS

| | | |
|---|---|---|
| 2005/0009263 A1 | 1/2005 | Yeo et al. |
| 2005/0017377 A1 | 1/2005 | Joshi et al. |
| 2005/0093154 A1* | 5/2005 | Kottantharayil .... H01L 29/1054 257/745 |
| 2005/0156202 A1* | 7/2005 | Rhee ................ H01L 29/66795 257/213 |
| 2005/0224800 A1 | 10/2005 | Lindert et al. |
| 2007/0090416 A1 | 4/2007 | Doyle et al. |
| 2007/0145487 A1 | 6/2007 | Kavalieros et al. |
| 2008/0073667 A1 | 3/2008 | Lochtefeld |
| 2008/0135886 A1* | 6/2008 | Irisawa .................. H01L 21/84 257/255 |
| 2008/0248616 A1 | 10/2008 | Shang et al. |
| 2009/0267155 A1 | 10/2009 | Izumida et al. |
| 2011/0241084 A1* | 10/2011 | Wu ....................... H01L 29/165 257/288 |
| 2011/0284967 A1 | 11/2011 | Cheng et al. |

FOREIGN PATENT DOCUMENTS

| | | |
|---|---|---|
| CN | 101364545 | 2/2009 |
| CN | 101443917 | 5/2009 |

* cited by examiner

STRAINED CHANNEL FIELD EFFECT TRANSISTOR

This is a divisional application of U.S. patent application Ser. No. 13/161,649, filed Jun. 16, 2011, now U.S. Pat. No. 9,761,666, the entire disclosure of which is hereby incorporated by reference.

BACKGROUND

Variations of metal-oxide-semiconductor field-effect transistor (MOSFET) structures have been explored for improvement in manufacturability and performance. One variation has been known as a "finFET", which includes a strip or "fin" of a material, such as silicon, and a gate formed to surround the fin on three exposed sides. The channel region of the device is located in the fin, and introduction of strain into such a strip or fin has been explored.

Silicon germanium (SiGe) fins located in the channel regions of a complementary metal-oxide-semiconductor (CMOS) device have been used to increase field effect transistor (FET) performance. However, as the fin length scales to larger lengths, axial stress components imparted on the fin may become relaxed and cause less than optimal finFET performance.

SUMMARY

The present disclosure provides for many different embodiments. According to one embodiment, a semiconductor device is provided. The device includes a substrate including at least two isolation features, a fin substrate disposed between and above the at least two isolation features, and an epitaxial layer disposed over exposed portions of the fin substrate. According to one aspect, the epitaxial layer may be disposed over a top surface and sidewalls of the fin substrate. According to another aspect, the fin substrate may be disposed substantially completely above the at least two isolation features.

In yet another embodiment, a semiconductor device includes a substrate including at least two isolation features, a substrate buffer region disposed between the at least two isolation features, and a fin substrate disposed above the substrate buffer region, between the at least two isolation features, and at a vertical level substantially completely above the at least two isolation features. The device further includes a source/drain epitaxial layer disposed over a top surface and sidewalls of the fin substrate.

The present disclosure also provides for a method of fabricating a semiconductor device. In one embodiment, the method includes providing a substrate including at least two isolation features, forming a fin substrate between the at least two isolation features, and at a vertical level above the at least two isolation features, and forming an epitaxial layer over exposed portions of the fin substrate. According to one aspect, the epitaxial layer may be deposited over a top surface and sidewalls of the fin substrate. According to another aspect, the fin substrate may be deposited substantially completely above the at least two isolation features.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
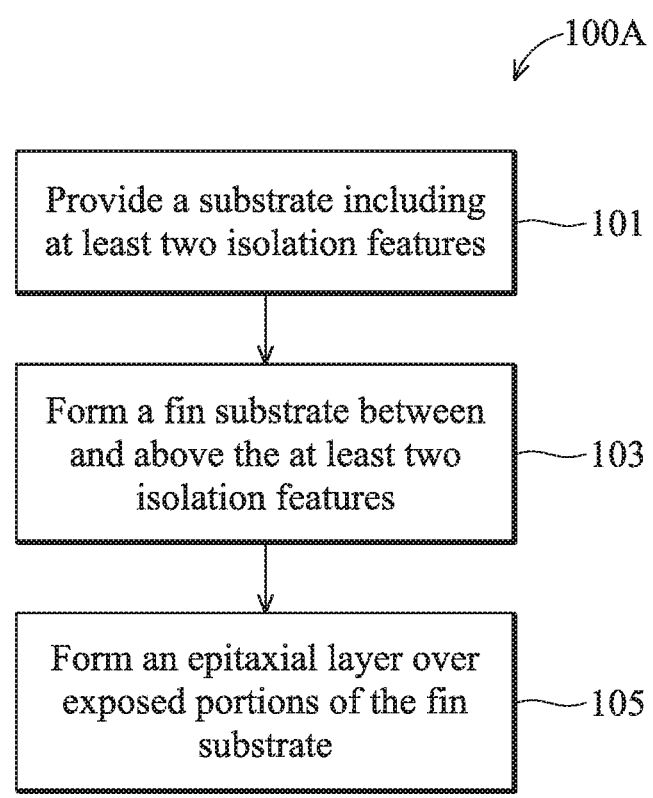
FIGS. 1A and 1B are flowcharts of methods of fabricating a semiconductor device in accordance with embodiments of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1A, a flowchart is shown illustrating a method 100A for fabricating a semiconductor device in accordance with an embodiment of the present disclosure. The method 100A includes providing a substrate including at least two isolation features at block 101, depositing a fin substrate between and above the at least two isolation features at block 103, and depositing an epitaxial layer over exposed portions of the fin substrate at block 105.

Figure 1B:
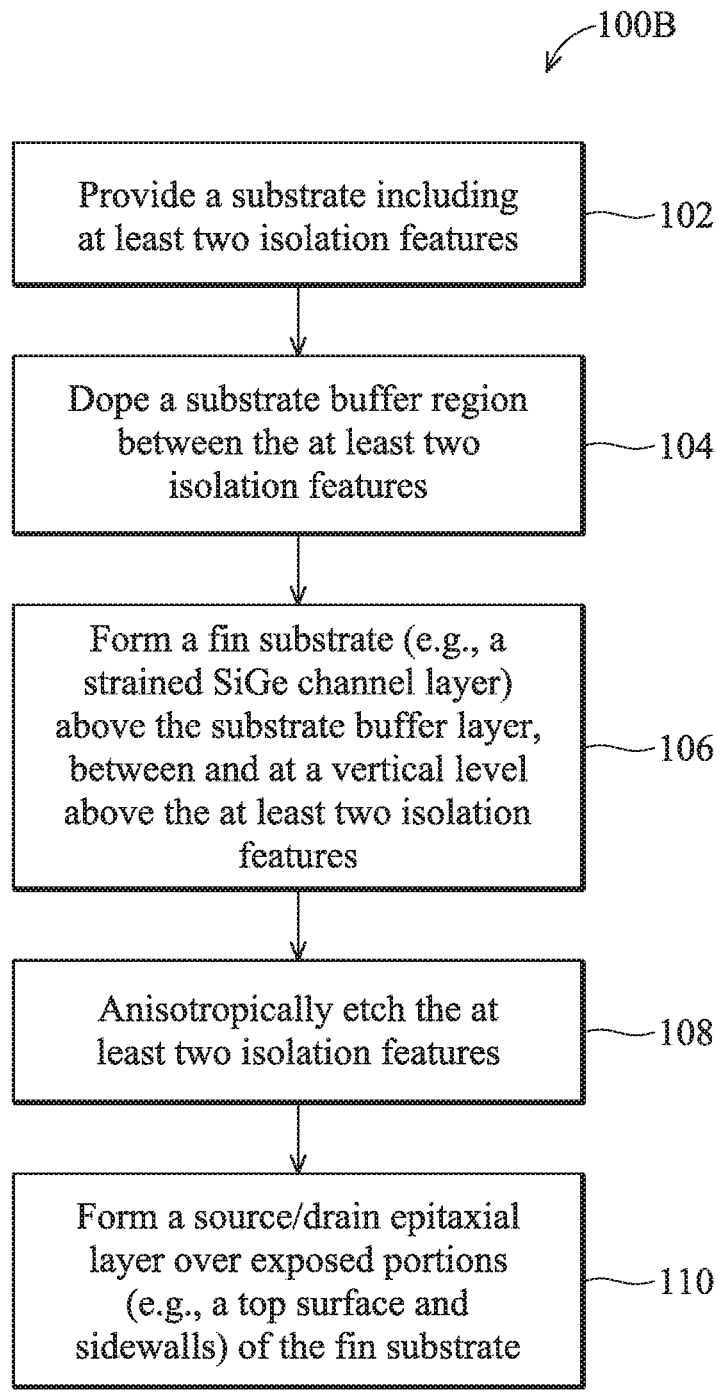

Referring now to FIG. 1B, a flowchart is shown illustrating a method 100B for fabricating a semiconductor device in accordance with another embodiment of the present disclosure. The method 100B begins at block 102 with providing a substrate including at least two isolation features. The isolation features may include shallow trench isolation (STI) features filled with an oxide or dielectric, but other isolation features may be used and are within the scope of the present disclosure.

The substrate may include various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

At block 104, method 100B further includes doping a substrate buffer region between the at least two isolation features.

At block 106, method 100B further includes depositing a fin substrate (e.g., a strained silicon germanium (SiGe) channel layer) above the substrate buffer region, between the at least two isolation features, and at a vertical level above the at least two isolation features.

At block 108, method 100B further includes anisotropically etching the at least two isolation features.

At block 110, method 100B further includes depositing a source/drain epitaxial layer over exposed portions of the fin substrate (e.g., the strained SiGe channel layer). In one example, the source/drain epitaxial layer is deposited to cover exposed surfaces (e.g., of the strained SiGe channel layer). In another example, the epitaxial layer is deposited at a vertical level above etched regions of the at least two isolation features (e.g., etched oxide of the isolation feature). In yet another example, the epitaxial layer is deposited over a top surface and sidewalls of the fin substrate.

The various structures in the methods 100A and 100B described above may be formed by various deposition, pattern, and/or etch techniques. It should be noted that the operations of the methods 100A and 100B may be rearranged or otherwise modified within the scope of the various aspects. It is further noted that additional processes may be provided before, during, and after the methods 100A and 100B of FIGS. 1A and 1B, and that some other processes may only be briefly described herein. Thus, other implementations are possible with the scope of the various aspects described herein.

In one example, the methods 100A and 100B may further include forming a gate electrode directly over the fin substrate (or strained SiGe channel layer) or directly over the epitaxial layer, and/or forming spacers adjacent the sides of the gate electrode. In other words, in one embodiment, the epitaxial layer may be deposited to cover surfaces of the fin substrate not masked by the gate electrode and/or the spacers, or in another embodiment, the gate electrode and/or the spacers may be formed over the epitaxial layer.

In another example, the substrate, the fin substrate, and the epitaxial layer may each be comprised of silicon (Si), germanium (Ge), or a combination of Si and Ge. In other embodiments, the substrate, the fin substrate, and the epitaxial layer may each be comprised of other materials, such as Group III-V compounds or combinations thereof (e.g., InGaAs, InAs, GaSb, or InGaSb as channel material and AlAsSb as a buffer). The material of the substrate, fin substrate, and epitaxial layer may each be chosen such that the resulting stress is beneficial for either holes or electrons depending on the type of device being fabricated.

In yet another example, the fin substrate may be deposited as a strained SiGe channel layer comprised of between about 25% Ge and about 50% Ge, having a length between about 100 nm and about 200 nm, a width between about 10 nm and about 20 nm, and a thickness between about 10 nm and about 40 nm. In other examples, the fin substrate may have a lower limit length of about 100 nm and substantially no upper limit length.

In yet another example, the fin substrate may be deposited as a strained SiGe channel layer comprised of about 50% Ge, having a length of about 100 nm or greater, a width of about 10 nm, and a height above the at least two isolation features of about 10 nm.

In yet another example, the fin substrate or the epitaxial layer may be deposited to have a compressive uni-axial strain forming a PMOS device, or wherein the fin substrate is deposited to have a tensile uni-axial strain forming an NMOS device.

In yet another example, the epitaxial layer may be deposited as a passivation layer comprised of silicon.

Figure 2A:
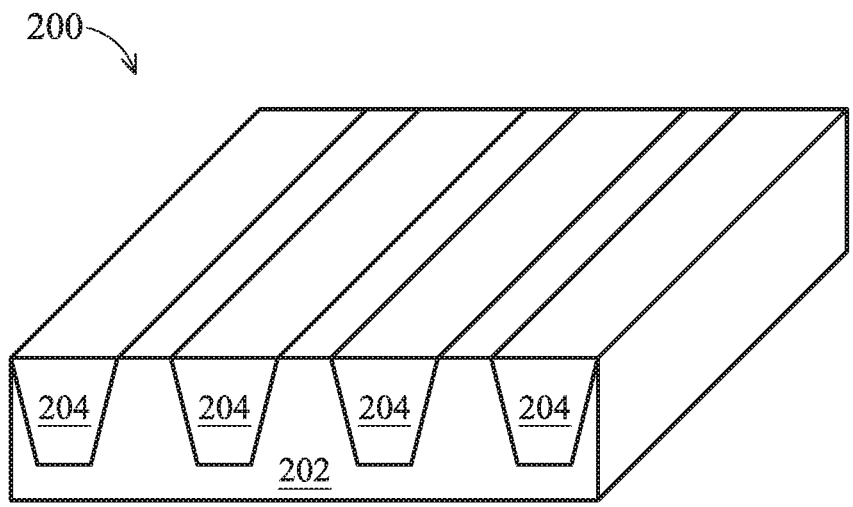
FIGS. 2A-2D and 3A-3C are perspective cross-sectional views of a semiconductor device at various stages of fabrication in accordance with an embodiment of the present disclosure.

Referring now to FIGS. 2A-2D, perspective cross-sectional views of a semiconductor device at various stages of fabrication are illustrated in accordance with an embodiment of the present disclosure. FIG. 2A illustrates a semiconductor device 200 having a substrate 202 including a plurality of (and at least two) isolation features 204.

In one embodiment, substrate 202 may include a semiconductor substrate, and may be comprised of silicon, or alternatively may include silicon germanium, gallium arsenide, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

In one embodiment, substrate 202 is comprised of silicon (Si), germanium (Ge), or a combination of Si and Ge, depending upon whether PMOS or NMOS devices are being fabricated. In one example, substrate 202 is comprised of silicon and substrate buffer region 203 is doped with p-type dopants to fabricate a PMOS device. In another example, substrate 202 is comprised of germanium or a combination of silicon and germanium and substrate buffer region 203 is doped with n-type dopants to fabricate an NMOS device.

The isolation features 204 may include shallow trench isolation (STI) features filled with an oxide or dielectric, but other isolation features may be used and are within the scope of the present disclosure. The oxide or dielectric of isolation features 204 may be formed by various processes, such as thermal oxidation and/or plasma enhanced chemical vapor deposition (PECVD).

In one embodiment, semiconductor substrate 202 may be comprised of single crystalline, P type silicon, featuring a <100> crystallographic orientation. Other crystallographic orientations are within the scope of the present disclosure. A silicon nitride layer, for example having a thickness between about 1000 to 2000 Angstroms, may formed on the top surface of semiconductor substrate 202, via low pressure chemical vapor deposition (LPCVD), or plasma enhanced chemical vapor deposition (PECVD) procedures, for example. Conventional photolithographic and reactive ion etching (RIE) procedures may be used to define shallow trench shapes, through the silicon nitride layer, and to a depth between about 3000 to 6000 Angstroms in semiconductor substrate 202. The RIE procedure may be performed using $Cl_2$ as an etchant for both the silicon nitride layer and the semiconductor substrate. After removal of the photoresist shape used to define shallow trench shapes, via plasma oxygen ashing procedures, for example, a silicon oxide layer may be deposited via LPCVD or PECVD procedures at a thickness between about 4000 to 10000 Angstroms, using tetraethylorthosilicate (TEOS) as a source, to completely fill the shallow trench shapes. A chemical mechanical polishing (CMP) procedure may then be employed to remove portions of the silicon oxide layer from the top surface, resulting in silicon oxide filled, STI regions, or isolation features 204.

Figure 2B:
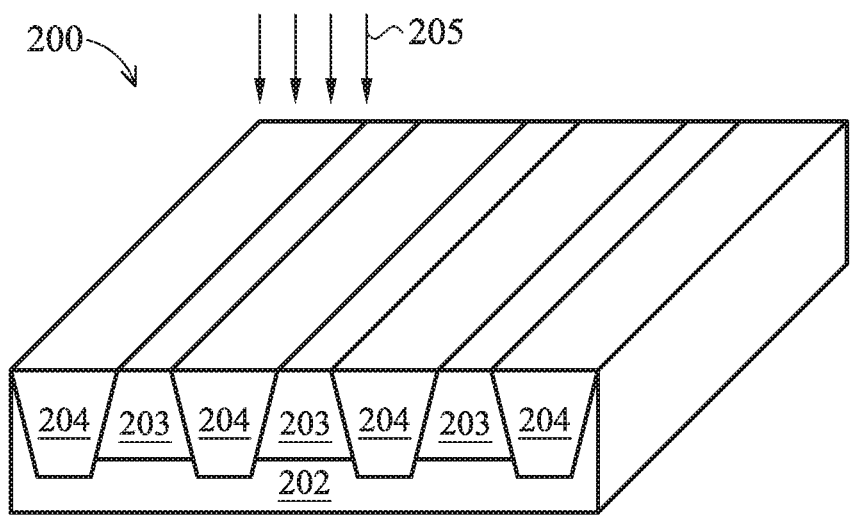

FIG. 2B illustrates the formation of substrate buffer or fin substrate buffer regions 203 between isolation features 204, such as by an ion implantation or doping process 205. The formation of substrate buffer regions may be accomplished utilizing a photoresist shape (not shown in the drawings), to block a portion of the semiconductor substrate from an ion implantation procedure performed using p-type dopants or n-type dopants, as desired to fabricate PMOS and/or NMOS regions. P-type dopants, such as boron ions, may be applied at an energy between about 20 to 400 KeV, and at a dose between about 1e12 and about 1e14 atoms/$cm^2$. In other cases, or in additional fabrication areas, n-type implantation, such as arsenic or phosphorous ions, may be performed at an energy between about 20 to about 500 KeV, at a dose between about 1e12 to about 1e14 atoms/$cm^2$. If not previously performed, threshold adjust and anti-punch through implants may also be performed. Additional ion implantation procedures can be used. Removal of the photoresist block out shapes may be accomplished via plasma oxygen ashing procedures.

In yet another example, substrate buffer region 203 may be doped with p-type dopants at levels ranging between about 1e17 $cm^{-3}$ and about 1-19 $cm^{-3}$, and in one example is a silicon buffer region doped at 1e18 $cm^{-3}$.

In yet another example, a substrate buffer region may be formed by removing a portion of the silicon substrate and epitaxially regrowing an in-situ doped layer.

Figure 2C:
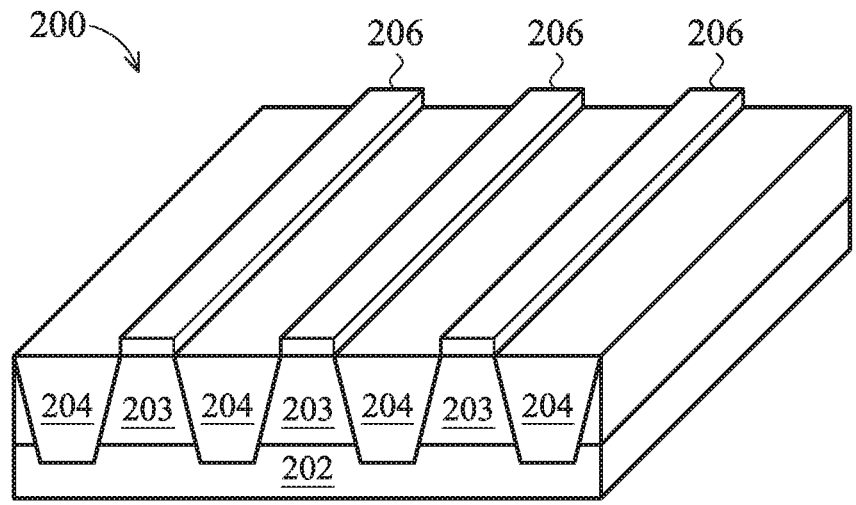

FIG. 2C illustrates a plurality of fin substrates 206 (e.g., strained silicon germanium (SiGe) channel layers) disposed above the substrate 202 and between at least two isolation features 204. In one example, fin substrates 206 are further disposed above substrate buffer regions 203 and at a vertical level above the at least two isolation features 204. In one aspect, fin substrates 206 are formed at a vertical level substantially completely above the at least two isolation features. In another aspect, fin substrate 206 may be formed to have a portion at a vertical level above the at least two isolation features. In another example, the fin substrate 206 is formed as a strained SiGe channel layer comprised of between about 25% Ge and about 50% Ge, having a length between about 100 nm and about 200 nm, a width between about 10 nm and about 20 nm, and a thickness between about 10 nm and about 40 nm. In yet another example, the fin substrate 206 is a strained SiGe channel layer comprised of about 50% Ge, having a length of about 100 nm, a width of about 10 nm, and a height above the at least two isolation features of about 10 nm.

In one aspect of the present disclosure, fin substrates 206 may be formed by a SiGe or Ge condensation technique or epitaxially grown, as disclosed in U.S. application Ser. No. 11/861,931, the entire disclosure of which is incorporated by reference herein. For example, fin substrates 206 may be formed by selective epitaxial growth in any suitable epitaxial deposition system and process, such as metal-organic chemical vapor deposition (MOCVD), atmospheric pressure CVD (APCVD), low-(or reduced-) pressure CVD (LPCVD), ultra-high vacuum CVD (UHCVD), molecular beam epitaxy (MBE), or atomic layer deposition (ALD). In a CVD process, selective epitaxial growth typically includes introducing a source gas into a chamber. The source gas may include at least one precursor gas and a carrier gas. The reactor chamber may be heated by, for example, RF-heating, and the growth temperature in the chamber may range from about 300 degrees Celsius to about 900 degrees Celsius, depending on the composition of the crystalline material of the fin substrate to be formed. The epitaxial growth system may be a single-wafer or multiple-wafer batch or inline reactor.

Figure 2D:
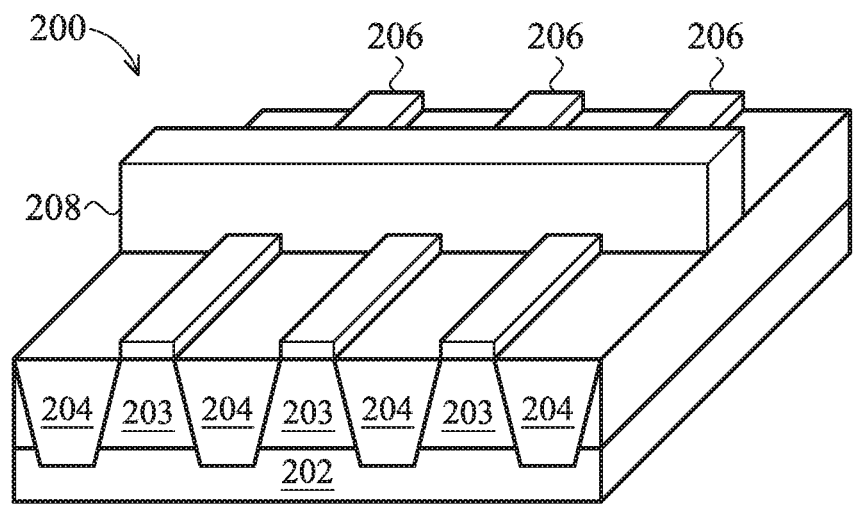

FIG. 2D illustrates the formation of a gate 208 formed in a perpendicular direction to the channel layers 206, although gate 208 is not limited to this particular direction. In one example, gate 208 is formed directly over fin substrates 206 and isolation features 204. In other examples, as will be disclosed with respect to FIGS. 7A-7D, gate 208 may be formed over a prior grown epitaxial layer. Thus, gate 208 may be formed over a top surface and sidewalls of fin substrate 206 (see e.g., FIGS. 2D and 3A) or over a top surface and sidewalls of a prior grown epitaxial layer (see e.g., FIG. 7D).

In one example, gate 208 may be formed by deposition and selective removal of a gate dielectric material and a conductive gate material. The gate dielectric material may include $SiO_2$, $Si_3N_4$, $HfO_2$, HfSiON, and/or HfSiO. The conductive gate material may include polysilicon, amorphous Si, Ge or SiGe gate material, and/or a metal or metal alloy.

Figure 3A:
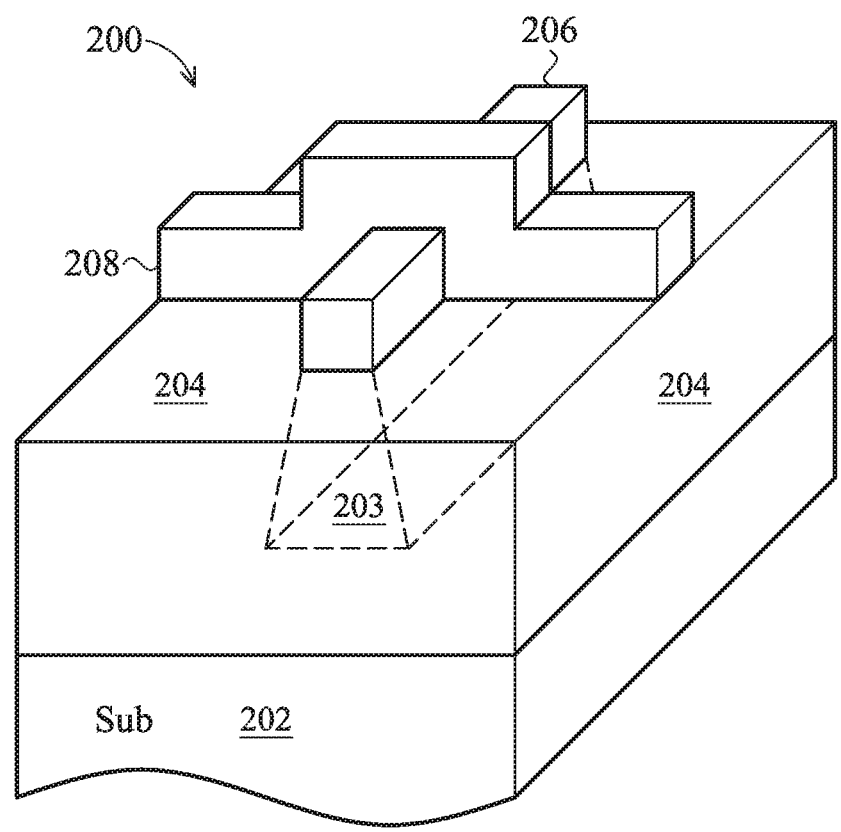
Figure 3B:
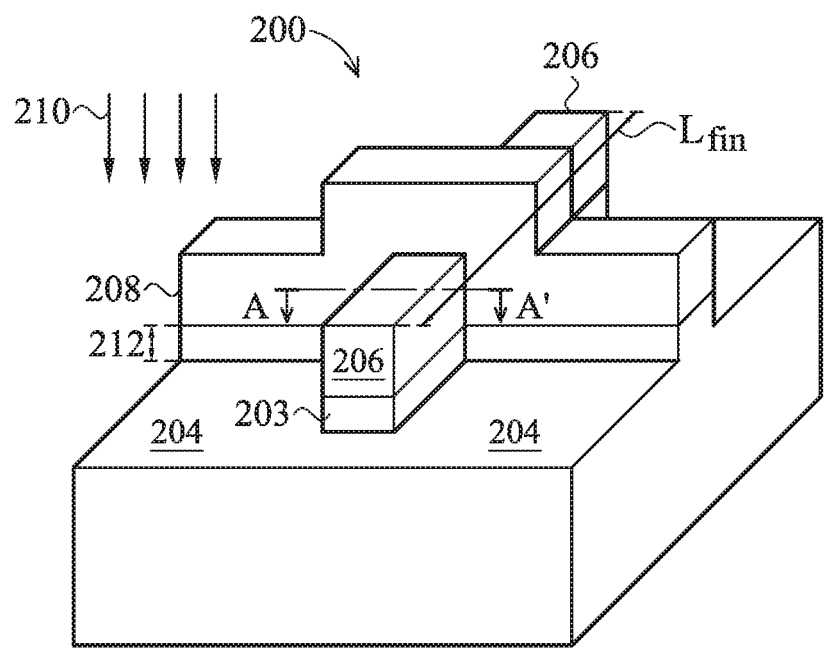
Figure 3C:
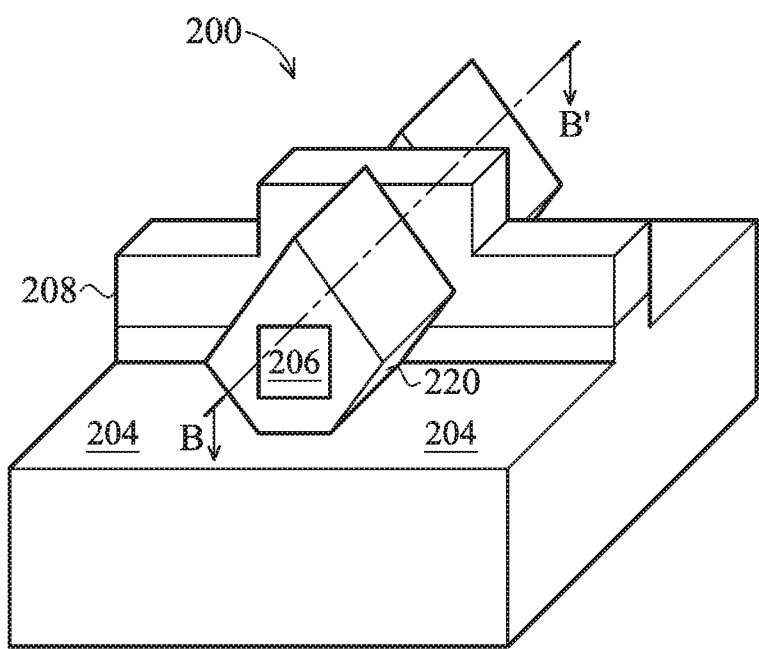

Referring now to FIGS. 3A-3C, closer perspective cross-sectional views of device 200 are illustrated at various stages of fabrication in accordance with an embodiment of the present disclosure.

FIG. 3A illustrates a closer view of device 200 with a single fin substrate 206 and substrate buffer region 203 between two isolation features 204. In one example, fin substrate 206 is deposited as a strained channel layer having a compressive uni-axial strain when forming a PMOS device, and having a tensile uni-axial strain when forming an NMOS device. As noted above, fin substrate 206 may be comprised of silicon (Si), germanium (Ge), a combination of Si and Ge, Group III-V compounds, or combinations thereof. In one example, fin substrate 206 comprises a strained SiGe channel layer in which a transversal stress component is fully relaxed due to the fin dimensions (e.g., in the width direction, the strain is relaxed because the width of the fin is relatively small as compared to the fin length or longitudinal direction), leading to a uniaxial stress in the channel length or longitudinal direction.

After a pre-clean procedure performed using a dilute or buffered hydrofluoric acid solution, for example, the fin substrate 206 may be selectively grown on exposed semiconductor surfaces above substrate buffer regions 203. Various deposition processes may be used. In one example, an ultra-high vacuum chemical vapor deposition (UHV-CVD) procedure may be employed. The addition of chlorine gas or HCl gas may enhance the selectivity of the epitaxial growth. The growth of the fin substrate 206 may be selectively deposited using silane ($SiH_4$) or disilane ($Si_2H_6$), and germane ($GeH_4$) or digermane as reactants. In one example, a strained SiGe layer may be achieved using a germanium weight percent between about 25% to about 50%. The thickness is chosen to be sufficient enough to contain the inversion charge, however not thick enough to allow defect to lead to unwanted device leakage.

In another embodiment, the fin substrate 206 may be formed by growing a non-selective layer and subsequently using a patterning procedure to remove portions of the non-selective channel layers from non-active device regions, such as from the top surface of isolation features 204.

In one example, an undoped polysilicon layer may next be deposited (e.g., via LPCVD procedures), and conventional photolithographic and anisotropic RIE procedures (e.g., using $Cl_2$ or $SF_6$ as an etchant) may be used to define polysilicon gate structure 208. The photoresist shape, (not shown in the drawings), used as a defining mask for the polysilicon gate structures, may be removed via plasma oxygen ashing procedures and careful wet cleans.

Figure 5:
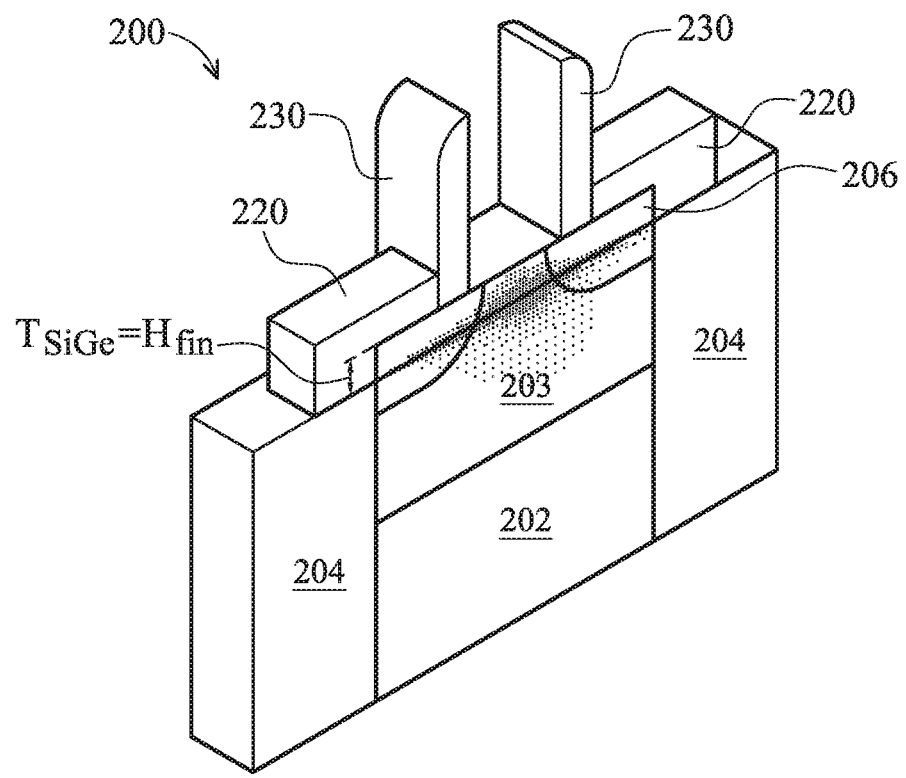
FIG. 5 is a perspective cross-sectional view of the semiconductor device of FIG. 3C along a line B-B' in accordance with embodiments of the present disclosure.

A silicon nitride layer may then be deposited via LPCVD or PECVD procedures, and an anisotropic RIE procedure using $SF_6$ as an etchant may be used to define silicon nitride spacers 230 on the sides of the polysilicon gate structures, as shown in FIG. 5.

FIG. 3B illustrates an anisotropic etch 210 of the isolation features 204, such as an anisotropic etch of a field oxide of shallow trench isolation features. Etch 210 forms a recess 212 within the isolation features 204. Various etch techniques, such as dry and/or wet etch techniques may be used to etch the isolation features 204. In one example, an oxide etcher with a fluorinated etchant gas may be used in conjunction with a patterned photoresist. In another example, an anisotropic RIE procedure (e.g., using $Cl_2$ or $SF_6$ as an etchant) may be used.

FIG. 3C then illustrates the formation of an epitaxial layer 220 disposed over exposed portions of fin substrate 206, such a strained SiGe channel layer. In one example, epitaxial layer 220 is formed over top and sidewall surfaces of fin substrate 206, and in another example, substantially covers all exposed portions of the fin substrate 206. In one example, epitaxial layer 220 may be comprised of silicon and may be selectively deposited by epitaxial growth using silane ($SiH_4$) or disilane ($Si_2H_6$). In another example, epitaxial layer 220 may function as source and drain regions of device 200. In this embodiment, gate 208 is previously formed directly over fin substrate 206 and epitaxial layer 220 is subsequently formed over exposed portions of fin substrate 206, including sidewalls and a top surface of fin substrate 206. In other embodiments, as noted above, an epitaxial layer may be formed prior to formation of gate 208 and thus, gate 208 may be formed over a prior formed epitaxial layer.

In one example, epitaxial layer 220 may be formed by selective epitaxial growth in any suitable epitaxial deposition system and process, such as metal-organic chemical vapor deposition (MOCVD), atmospheric pressure CVD (APCVD), low-(or reduced-) pressure CVD (LPCVD), ultra-high vacuum CVD (UHCVD), molecular beam epitaxy (MBE), or atomic layer deposition (ALD). In a CVD process, selective epitaxial growth typically includes introducing a source gas into a chamber. The source gas may include at least one precursor gas and a carrier gas. The reactor chamber may be heated by, for example, RF-heating, and the growth temperature in the chamber may range from about 300 degrees Celsius to about 900 degrees Celsius, depending on the composition of the crystalline material of the epitaxial layer to be formed. The epitaxial growth system may be a single-wafer or multiple-wafer batch or inline reactor.

Advantageously, the epitaxial layer 220 counterbalances relaxation of the longitudinal stress component in the lengthwise direction of the fin substrate 206, thus providing for improved transistor performance.

Figure 4A:
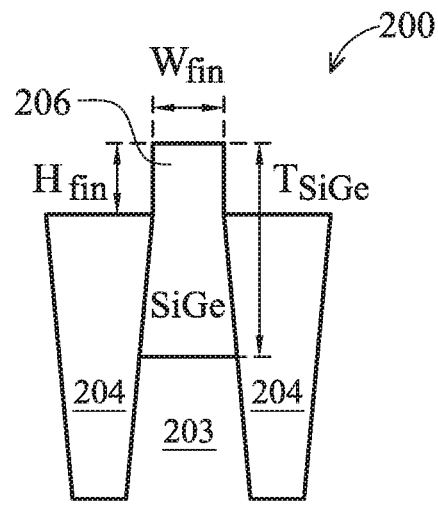
FIGS. 4A and 4B are embodiments of cross-sectional views of the semiconductor device of FIG. 3B along a line A-A' in accordance with embodiments of the present disclosure.
Figure 4B:
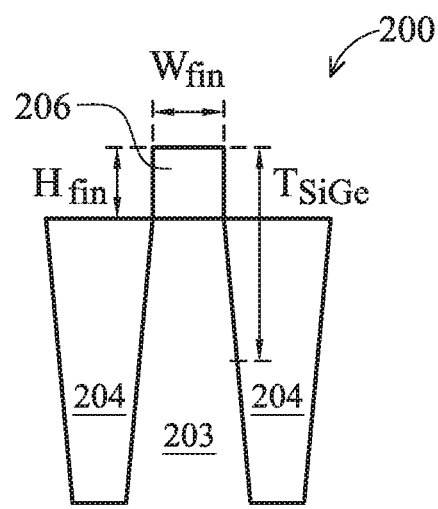

Referring now to FIGS. 4A and 4B, different embodiments are illustrated of cross-sectional views of semiconductor device 200 of FIG. 3B along a line A-A' in accordance with embodiments of the present disclosure. FIGS. 4A and 4B illustrate dimensions of fin substrate 206 above substrate buffer layer 203, including a fin width denoted by $W_{fin}$, a fin height above the etched isolation feature 204 denoted by $H_{fin}$, and a fin thickness denoted by $T_{SiGe}$. FIG. 3B illustrates a fin length denoted by $L_{fin}$.

In one example, the fin substrate 206 is a strained SiGe channel layer comprised of between about 25% Ge and about 50% Ge, and has a fin length $L_{fin}$ between about 100 nm and about 200 nm, a fin width $W_{fin}$ between about 10 nm and about 20 nm, and a fin thickness $T_{SiGe}$ between about 10 nm and about 40 nm.

Referring now to FIG. 5, a perspective cross-sectional view is illustrated of the semiconductor device 200 of FIG. 3C along a line B-B' in accordance with embodiments of the present disclosure. It is noted that FIG. 5 does not show gate 208. Device 200 includes epitaxial layer 220 disposed over exposed portions of fin substrate 206 (e.g., ends of the strained SiGe channel layer. In one example, the gate electrode 208 has a width (i.e., along the longitudinal axis of the fin substrate 206) of about 20 nm and the spacers 230 each have a length of about 15 nm.

In one example, as illustrated in FIGS. 4B and 5, the strained SiGe channel layer is comprised of about 50% Ge, and has a fin length $L_{fin}$ of about 100 nm, a fin width $W_{fin}$ of about 10 nm, and a fin height above the at least two isolation features $H_{fin}$ of about 10 nm. An average uni-axial compressive stress level of the SiGe channel layer 206 has been modeled to be greater than about 3 GPa.

As illustrated in one embodiment of FIGS. 4B and 5, a strained fin substrate 206 (e.g., a silicon germanium (SiGe) channel layer) is disposed above the substrate buffer region 203, between the at least two isolation features 204, and at a vertical level substantially completely above the at least two isolation features 204. For example, according to one aspect of the present disclosure, FIG. 4A illustrates a portion of fin substrate 206 above the at least two isolation features 204, and according to another aspect of the present disclosure, FIG. 4B illustrates the fin substrate 206 substantially completely above the at least two isolation features 204. In one example, FIGS. 4B and 5 further illustrate fin height above the etched isolation feature 204 denoted by $H_{fin}$ substantially equal to fin thickness denoted by $T_{SiGe}$.

In one example, the epitaxial layer 220 (e.g., source drain regions) is deposited to cover exposed surfaces of the fin substrate 206 (e.g., a strained SiGe channel layer), and in another example, epitaxial layer 220 is deposited to cover exposed surfaces of the strained SiGe channel layer 206 not masked by gate 208 and/or spacers 230, including sidewalls and top surfaces of the fin substrate 206. In yet another example, portions of the epitaxial layer 220 are deposited over portions of the etched isolation features 204 (e.g., etched oxide of the isolation feature). In yet another example, epitaxial layer 220 is comprised of the same material as the substrate, and in one example is comprised of silicon.

Recessing the isolation features provide a topography or template for epitaxial deposition of the epitaxial layer 220. For the case the epitaxial layer 220 is comprised of silicon, the inventors believe the SiGe channel will adapt to the silicon lattice structure and counterbalance relaxation of the longitudinal stress component. Advantageously, the epitaxial layer 220 optimizes transistor performance by counteracting relaxation of the longitudinal stress component of the fin substrate 206.

Figure 6:
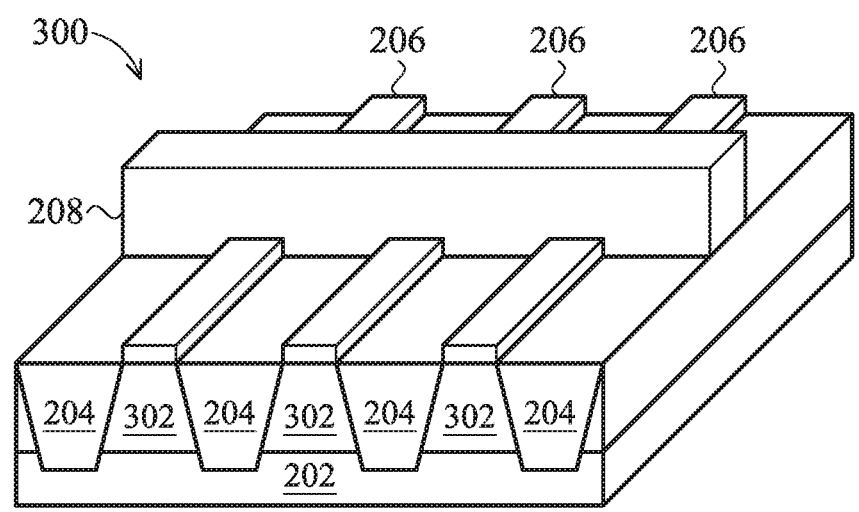
FIG. 6 is a perspective cross-sectional view of another semiconductor device in accordance with an embodiment of the present disclosure.

Referring now to FIG. 6, a perspective cross-sectional view is illustrated of semiconductor device 300 in accordance with another embodiment of the present disclosure. Device 300 includes a substrate 202, a plurality of (and at least two) isolation features 204, and a plurality of fin substrates 206 (e.g., strained silicon germanium (SiGe) channel layers) disposed above the substrate 202 and between at least two isolation features 204, and at a vertical level above the at least two isolation features 204. A gate 208 is formed across the fin substrates 206. Similarly numbered features in device 200 (such as the substrate 202, isolation features 204, fin substrate 206, and gate 208) are fully applicable in this embodiment with respect to device 300 although descriptions may not be repeated here to avoid repetitive descriptions. In this embodiment, device 300 further includes a germanium substrate 302 above which is formed respective SiGe channel layers for forming NMOS devices.

Referring now to FIGS. 7A-7D, perspective cross-sectional views are illustrated of another semiconductor device 400 at various stages of fabrication in accordance with an embodiment of the present disclosure.

Figure 7A:
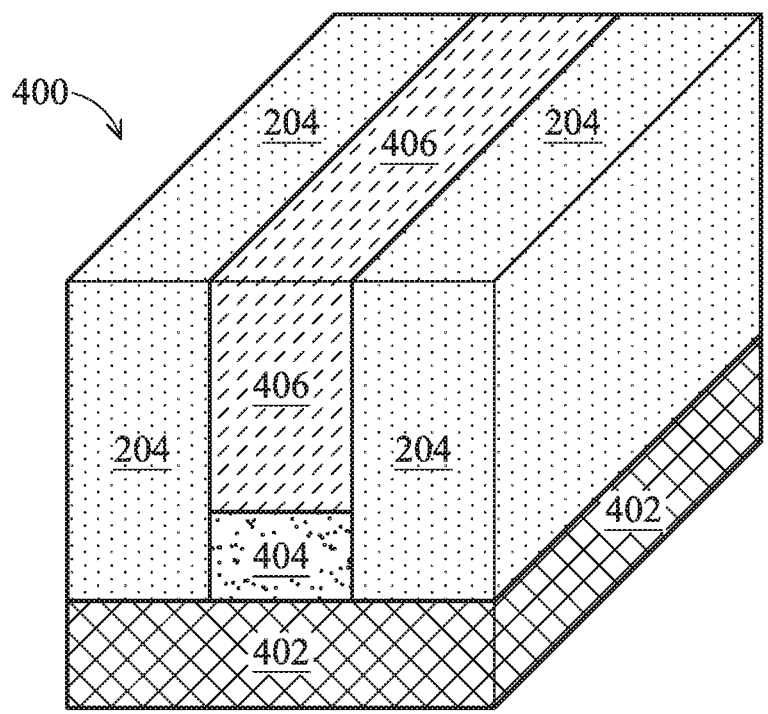
FIGS. 7A-7D are perspective cross-sectional views of another semiconductor device at various stages of fabrication in accordance with an embodiment of the present disclosure.

FIG. 7A illustrates semiconductor device 400 including a substrate 402, at least two isolation features 204, and a fin substrate 404, 406 between the at least two isolation features 204. Substrate 402 and isolation features 204 are substantially similar to substrate 202 and isolation features 204 described above with respect to device 200 (FIGS. 2A-5) and the descriptions of substrate 202 and isolation features 204 above are fully applicable in this embodiment although related description may not be included below to avoid repetitive descriptions. In one example, the fin substrate includes a first fin substrate 404 above substrate 402, and a second fin substrate 406 above first fin substrate 404. Fin substrates 404, 406 are between isolation features 204. Substrate 402 is comprised of a first semiconductor material, first fin substrate 404 is comprised of a second semiconductor material, and second fin substrate 406 is comprised of a third semiconductor material, and in one example substrate 402, first fin substrate 404, and second fin substrate 406 may each be comprised of silicon (Si), germanium (Ge), or a combination of Si and Ge.

In one embodiment, a dielectric material of isolation features 204 may be formed over substrate 402, and then a trench may be defined in the dielectric layer, extending to a top surface of substrate 402. Crystalline material of first fin substrate 404 and second fin substrate 406 is then formed within the trench by any suitable process, such as by a SiGe or Ge condensation technique or epitaxially grown, as disclosed in U.S. application Ser. No. 11/861,931, the entire disclosure of which has been incorporated by reference herein.

Figure 7B:
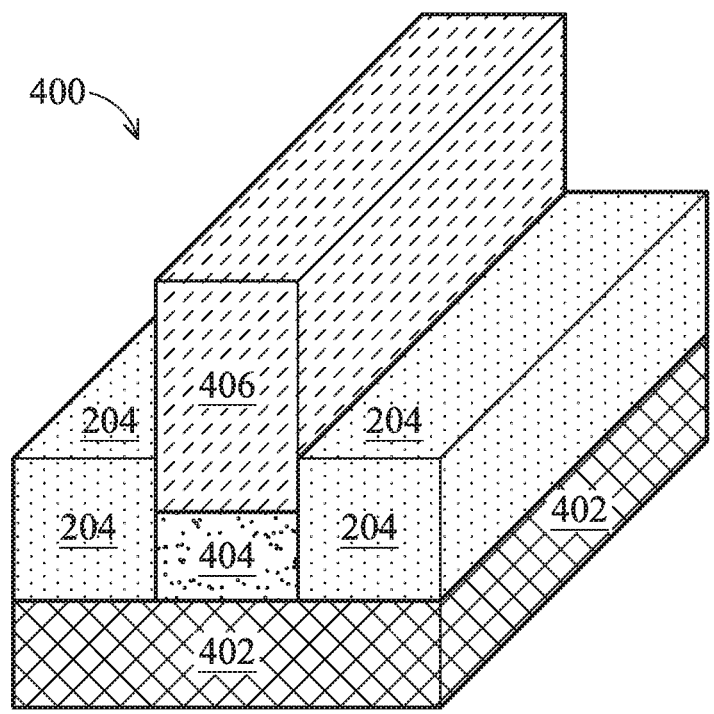

FIG. 7B illustrates an etch of the isolation features 204 to expose sidewalls of fin substrate 406. Various etch techniques, such as dry and/or wet etch techniques may be used to etch the isolation features 204. In one example, an oxide etcher with a fluorinated etchant gas may be used in conjunction with a patterned photoresist. In another example, an anisotropic RIE procedure (e.g., using $Cl_2$ or $SF_6$ as an etchant) may be used.

Figure 7C:
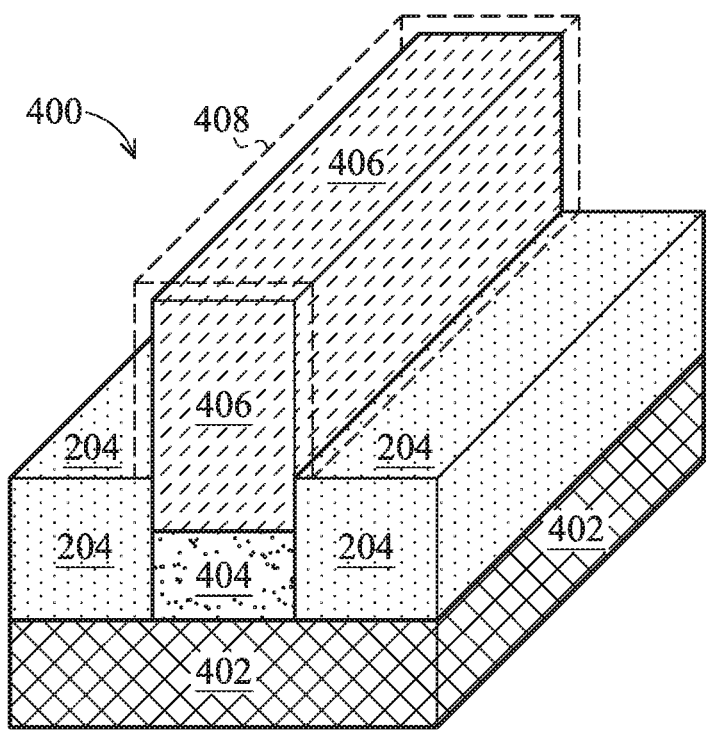

FIG. 7C illustrates the formation of an epitaxial layer 408 disposed over exposed portions of fin substrate 406, such as over top surfaces and sidewalls of fin substrate 406. In one example, epitaxial layer 408 substantially covers all exposed portions of the fin substrate 406. Epitaxial layer 408 is comprised of a fourth semiconductor material and in one example may be comprised of silicon (Si), germanium (Ge), or a combination of Si and Ge.

According to one aspect of the present disclosure, epitaxial layer 408 may be formed by selective epitaxial growth in any suitable epitaxial deposition system and process, such as metal-organic chemical vapor deposition (MOCVD), atmospheric pressure CVD (APCVD), low-(or reduced-) pressure CVD (LPCVD), ultra-high vacuum CVD (UHCVD), molecular beam epitaxy (MBE), or atomic layer deposition (ALD). In a CVD process, selective epitaxial growth typically includes introducing a source gas into a chamber. The source gas may include at least one precursor gas and a carrier gas. The reactor chamber may be heated by, for example, RF-heating, and the growth temperature in the chamber may range from about 300 degrees Celsius to about 900 degrees Celsius, depending on the composition of the crystalline material of the epitaxial layer to be formed. The epitaxial growth system may be a single-wafer or multiple-wafer batch or inline reactor.

Figure 7D:
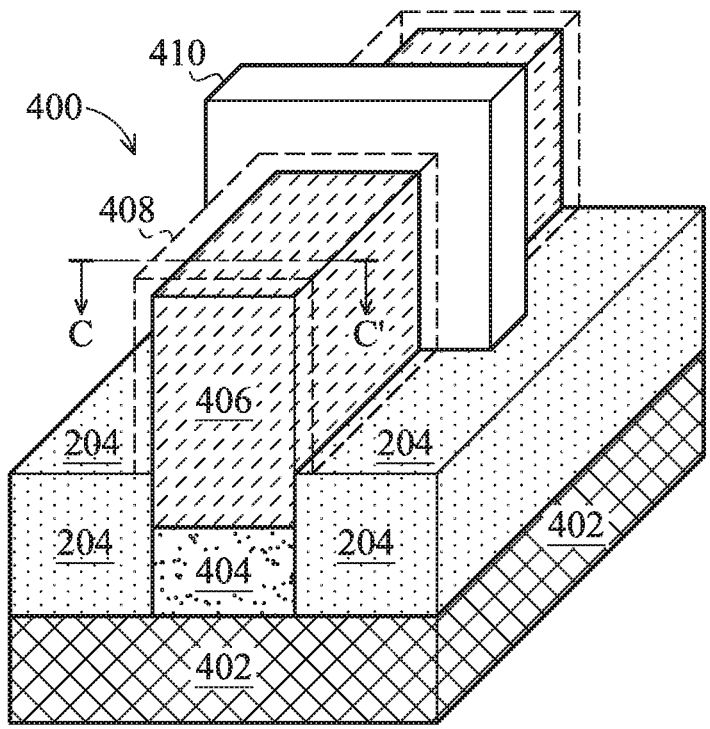

FIG. 7D illustrates the formation of gate 410 over epitaxial layer 408. In this embodiment, gate 410 is formed directly over epitaxial layer 408, including sidewalls and a top surface of epitaxial layer 408, and epitaxial layer 408 may function as a strained channel layer. Gate 410 may be substantially similar to gate 208 described above with respect to FIGS. 2D-3C and the descriptions of gate 208 above are fully applicable in this embodiment although related description may not be included below to avoid repetitive descriptions.

Referring now to FIGS. 8A-8G, 9A-9G, and 10A-10G, cross-sectional views are illustrated of the semiconductor device 400 of FIG. 7D along a line C-C' in accordance with embodiments of the present disclosure. As noted above, the substrate 402, the fin substrate 404, 406, and the epitaxial layer 408 are comprised of a first semiconductor material, a second semiconductor material, a third semiconductor material, and a fourth semiconductor material, respectively, and the first, second, third, and fourth semiconductor materials may be the same or different, and the first, second, third, and fourth semiconductor materials may have the same or different lattice constants. In one example, the substrate 402, the fin substrate 404, 406, and the epitaxial layer 408 may each be comprised of silicon (Si), germanium (Ge), a combination of Si and Ge, Group III-V materials (e.g., InGaAs, InAs, GaSb, InGaSb, AlAsSb), or combinations thereof. FIGS. 8A-8G, 9A-9G, and 10A-10G illustrate different permutations of Si, Ge, and SiGe materials for the fin substrate and the epitaxial layer in accordance with Tables 1, 2, and 3, respectively, below. In Tables 1, 2, and 3, the "r" prefix stands for "relaxed", the "c" prefix stands for "compressive strain", and the "t" prefix stands for "tensile strain".

TABLE 1

Figure 8A:
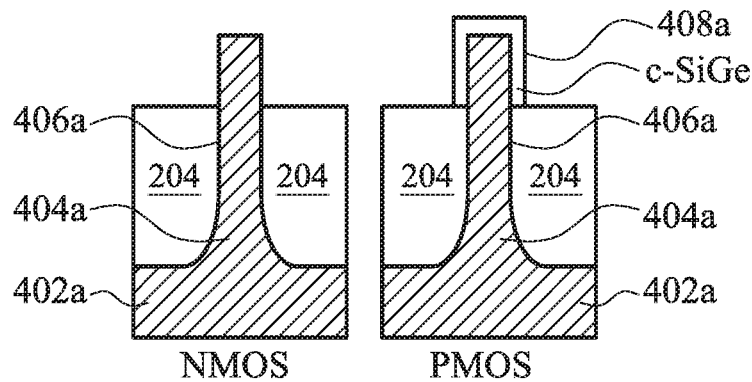
FIGS. 8A-8G, 9A-9G, and 10A-10G are embodiments of cross-sectional views of the semiconductor device of FIG. 7D along a line C-C' in accordance with embodiments of the present disclosure.
Figure 8B:
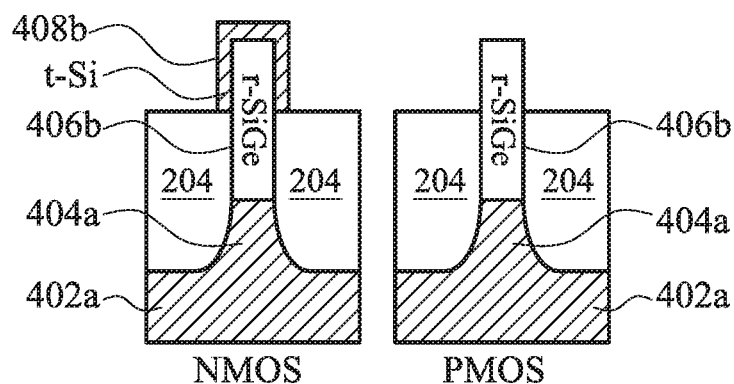
Figure 8C:
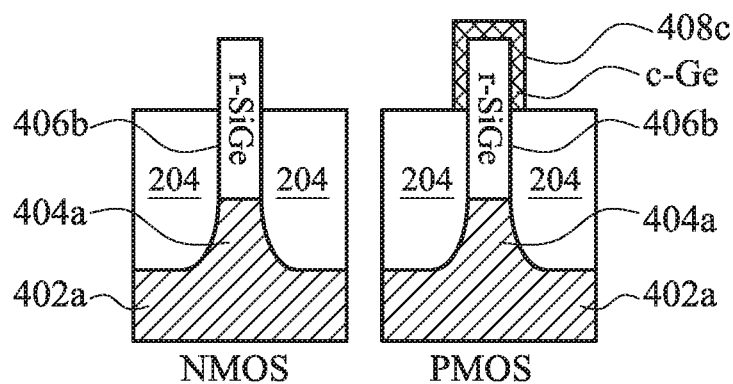
Figure 8D:
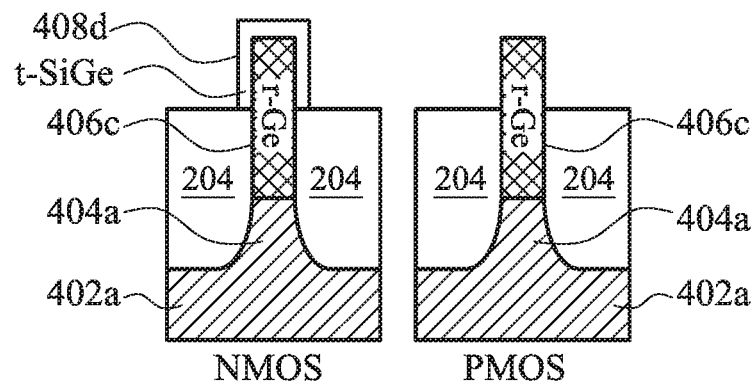
Figure 8E:
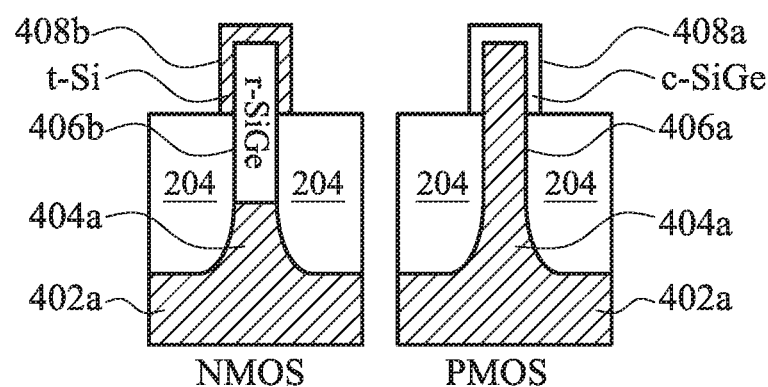
Figure 8F:
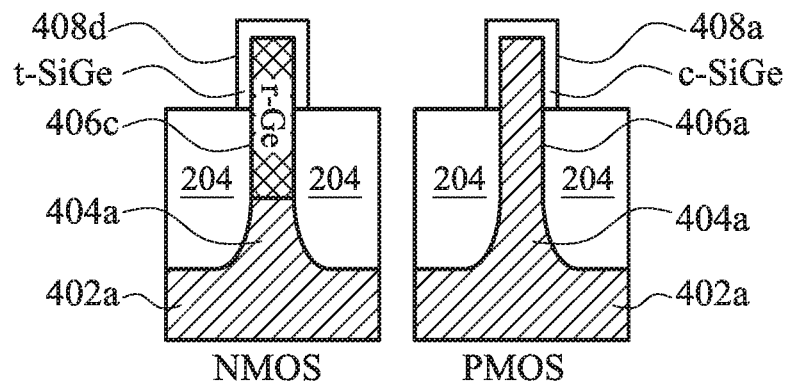
Figure 8G:
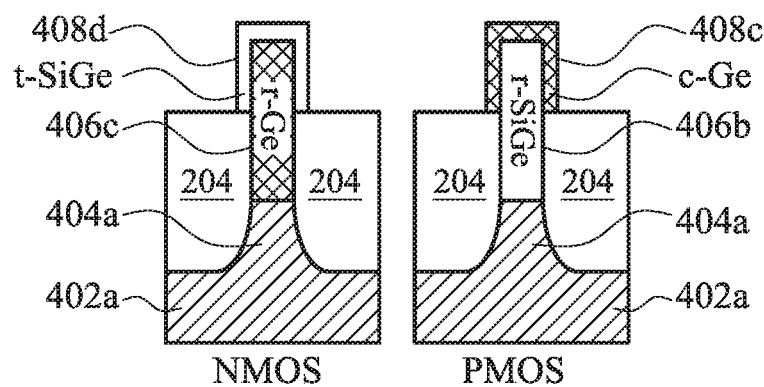

|  |  | Si fin | SiGe fin | | Ge fin | Hybrid | | |
|---|---|---|---|---|---|---|---|---|
|  |  | FIG. 8A | FIG. 8B | FIG. 8C | FIG. 8D | FIG. 8E | FIG. 8F | FIG. 8G |
| NMOS | fin | Si | r-SiGe | r-SiGe | r-Ge | r-SiGe | r-Ge | r-Ge |
|  | epi channel | — | t-Si | — | t-SiGe | t-Si | t-SiGe | t-SiGe |
|  | μ (intrinsic) | — | — | increased | increased | — | increased | increased |
|  | μ (strain) | — | increased | — | increased | increased | increased | increased |
| PMOS | fin | Si | r-SiGe | r-SiGe | r-Ge | Si | Si | r-SiGe |
|  | epi channel | c-SiGe | — | c-Ge | — | c-SiGe | c-SiGe | c-Ge |
|  | μ (intrinsic) | increased | increased | increased | increased | increased | increased | increased |
|  | μ (strain) | increased | — | increased | — | increased | increased | increased |

TABLE 2

Figure 9A:
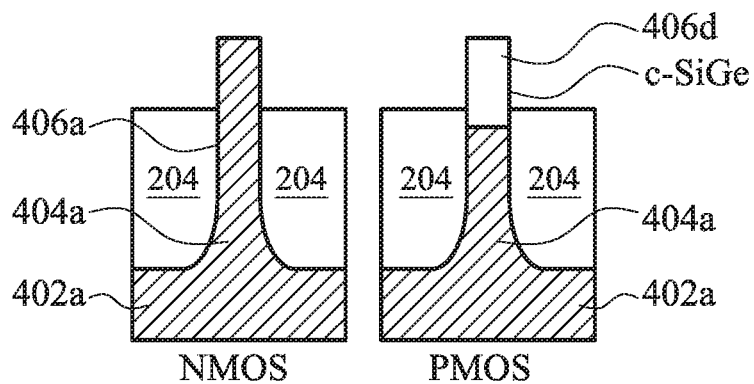
Figure 9B:
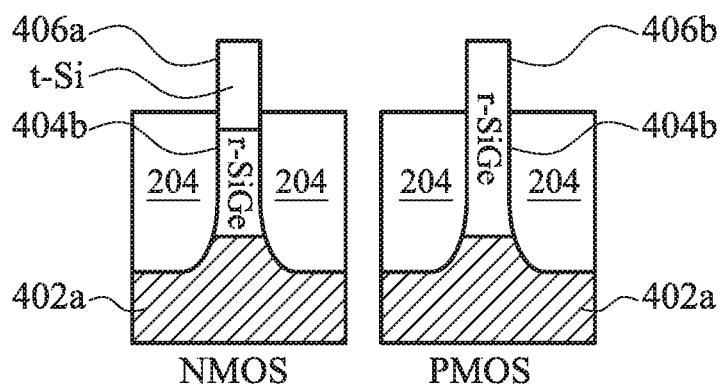
Figure 9C:
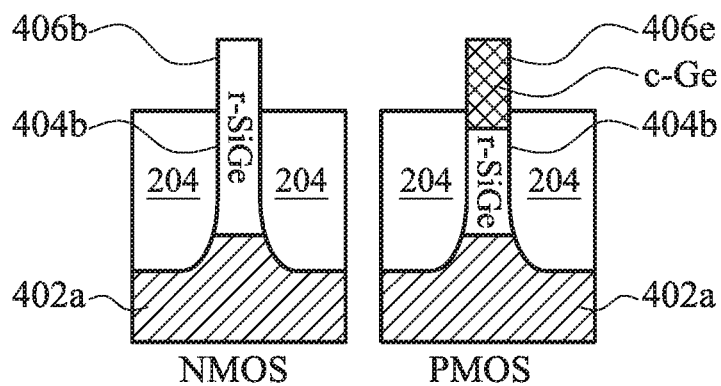
Figure 9D:
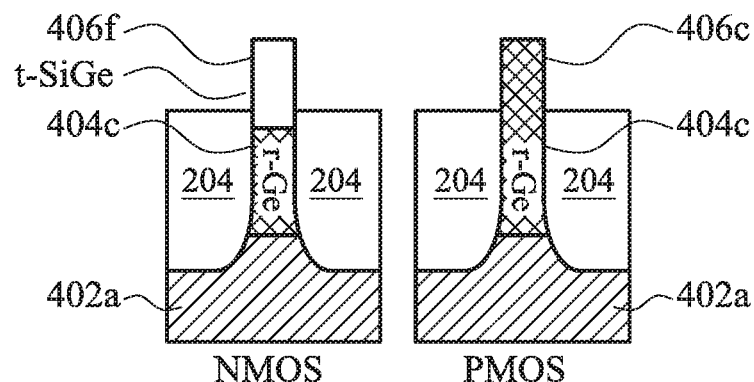
Figure 9E:
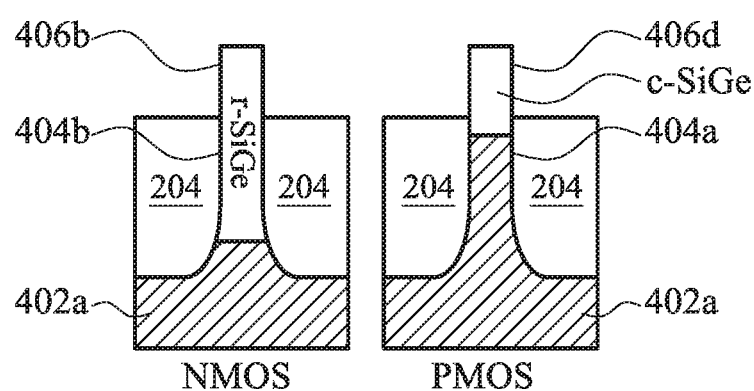
Figure 9F:
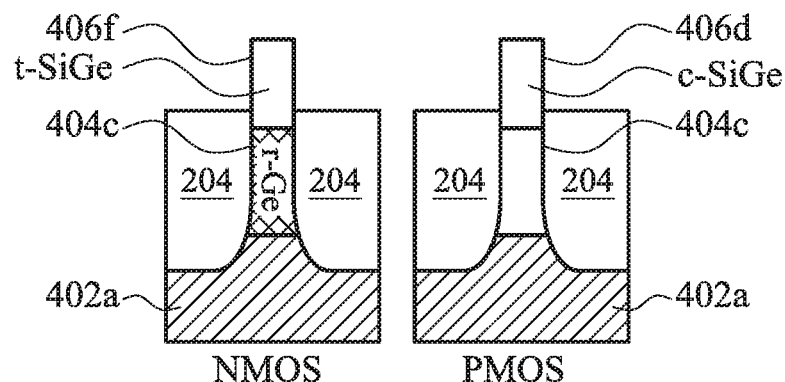
Figure 9G:
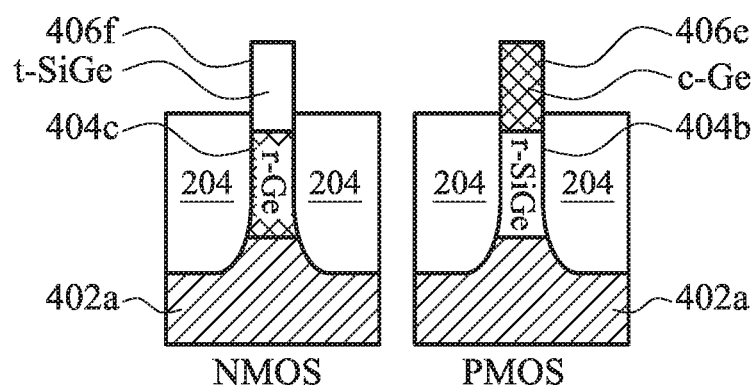

|  |  | Si fin | SiGe fin | | Ge fin | Hybrid | | |
|---|---|---|---|---|---|---|---|---|
|  |  | FIG. 9A | FIG. 9B | FIG. 9C | FIG. 9D | FIG. 9E | FIG. 9F | FIG. 9G |
| NMOS | fin | Si | r-SiGe | r-SiGe | r-Ge | r-SiGe | r-Ge | r-Ge |
|  | epi channel | — | t-Si | — | t-SiGe | t-Si | t-SiGe | t-SiGe |
|  | μ (intrinsic) | — | — | increased | increased | — | increased | increased |
|  | μ (strain) | — | increased | — | increased | increased | increased | increased |
| PMOS | fin | Si | r-SiGe | r-SiGe | r-Ge | Si | Si | r-SiGe |
|  | epi channel | c-SiGe | — | c-Ge | — | c-SiGe | c-SiGe | c-Ge |
|  | μ (intrinsic) | increased | increased | increased | increased | increased | increased | increased |
|  | μ (strain) | increased | — | increased | — | increased | increased | increased |

TABLE 3

Figure 10A:
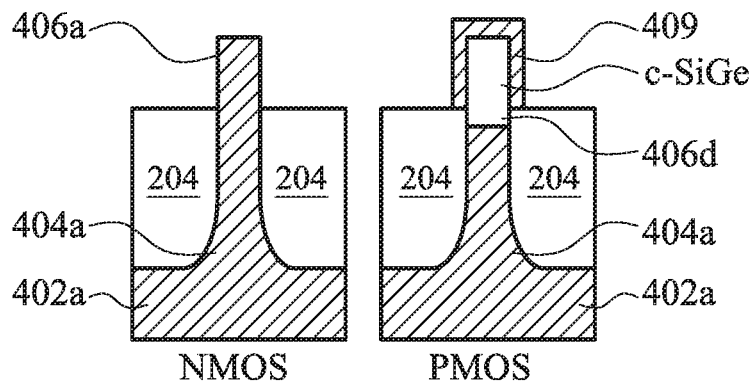
Figure 10B:
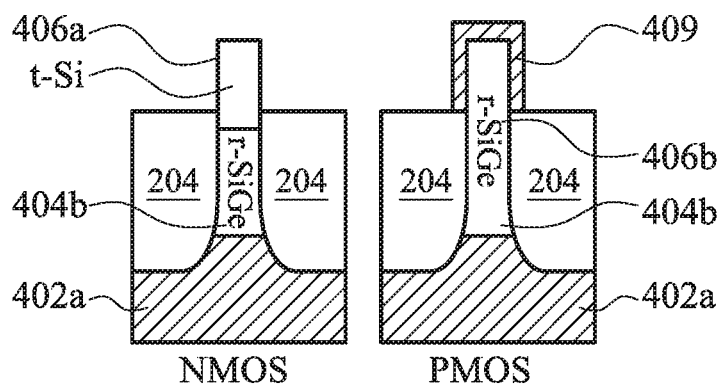
Figure 10C:
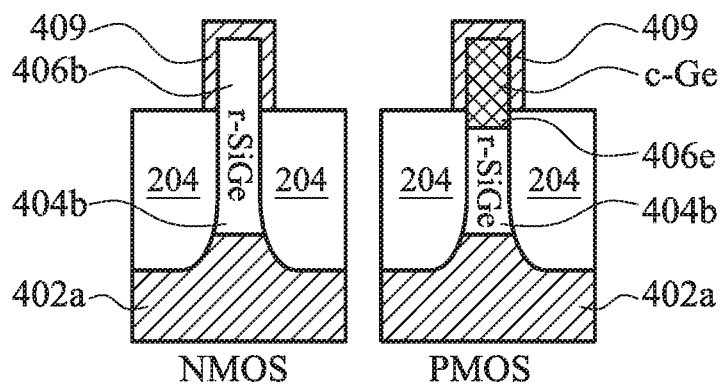
Figure 10D:
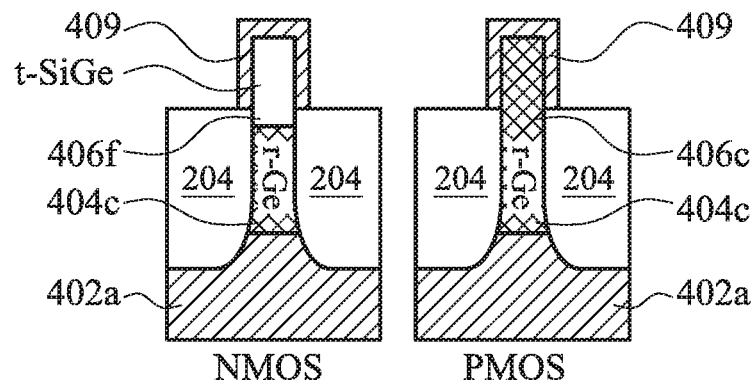
Figure 10E:
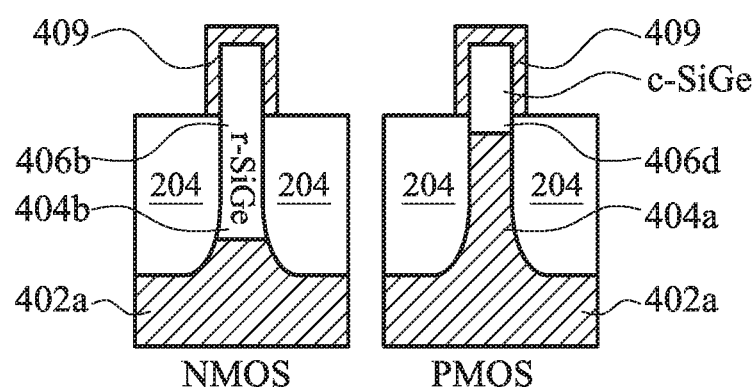
Figure 10F:
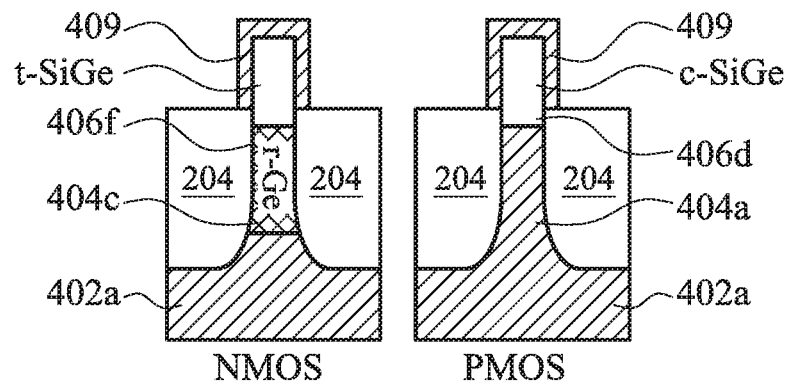
Figure 10G:
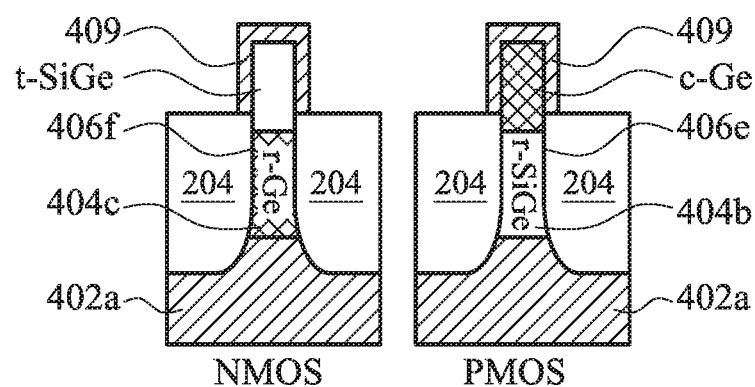

|  |  | Si fin | SiGe fin | | Ge fin | Hybrid | | |
| --- | --- | --- | --- | --- | --- | --- | --- | --- |
|  |  | FIG. 10A | FIG. 10B | FIG. 10C | FIG. 10D | FIG. 10E | FIG. 10F | FIG. 10G |
| NMOS | fin | Si | r-SiGe | r-SiGe | r-Ge | r-SiGe | r-Ge | r-Ge |
|  | epi channel | — | t-Si | — | t-SiGe | t-Si | t-SiGe | t-SiGe |
|  | Si cap | N | N | N | Y | N | Y | Y |
|  | μ (intrinsic) | — | — | increased | increased | — | increased | increased |
|  | μ (strain) | — | increased | — | increased | increased | increased | increased |
| PMOS | fin | Si | r-SiGe | r-SiGe | r-Ge | Si | Si | r-SiGe |
|  | epi channel | c-SiGe | — | c-Ge | — | c-SiGe | c-SiGe | c-Ge |
|  | Si cap | Y | Y | Y | Y | Y | Y | Y |
|  | μ (intrinsic) | increased | increased | increased | increased | increased | increased | increased |
|  | μ (strain) | increased | — | increased | — | increased | increased | increased |

FIG. 8A illustrates an NMOS device and a PMOS device each having substrate 402a, first fin substrate 404a, and second fin substrate 406a. Substrate 402, first fin substrate 404a, and second fin substrate 406a are each comprised of silicon. The PMOS device further includes epitaxial layer 408a comprised of SiGe and having a compressive uni-axial strain. Epitaxial layer 408a is formed over a top surface and sidewalls of fin substrate 406a. Intrinsic carrier mobility as compared to Si (μ(intrinsic)) and strain (μ(strain)) in the epitaxial layer 408a of the PMOS device is increased. The strain has an additive effect on the carrier mobility in the epitaxial layer.

FIG. 8B illustrates an NMOS device and a PMOS device each having substrate 402a, first fin substrate 404a, and second fin substrate 406b. Substrate 402 and first fin substrate 404a are each comprised of silicon, and second fin substrate 406b is comprised of relaxed SiGe. The NMOS device further includes epitaxial layer 408b comprised of Si and having a tensile uni-axial strain. Epitaxial layer 408b is formed over a top surface and sidewalls of fin substrate 406b. Strain μ(strain) in epitaxial layer 408b of the NMOS device is increased, and intrinsic carrier mobility μ(intrinsic) in fin substrate 406b of the PMOS device is increased.

FIG. 8C illustrates an NMOS device and a PMOS device each having substrate 402a, first fin substrate 404a, and second fin substrate 406b. Substrate 402 and first fin substrate 404a are each comprised of silicon, and second fin substrate 406b is comprised of relaxed SiGe. The PMOS device further includes epitaxial layer 408c comprised of Ge and having a compressive uni-axial strain. Epitaxial layer 408c is formed over a top surface and sidewalls of fin substrate 406b. Intrinsic carrier mobility μ(intrinsic) in the fin substrate 406b of the NMOS device is increased, and both intrinsic carrier mobility and strain μ(strain) in the epitaxial layer 408c of the PMOS device is increased.

FIG. 8D illustrates an NMOS device and a PMOS device each having substrate 402a, first fin substrate 404a, and second fin substrate 406c. Substrate 402 and first fin substrate 404a are each comprised of silicon, and second fin substrate 406c is comprised of relaxed Ge. The NMOS device further includes epitaxial layer 408d comprised of SiGe and having a tensile uni-axial strain. Epitaxial layer 408d is formed over a top surface and sidewalls of fin substrate 406c. Both intrinsic carrier mobility μ(intrinsic) and strain μ(strain) in the epitaxial layer 408d of the NMOS device is increased, and intrinsic carrier mobility μ(intrinsic) in the fin substrate 406c of the PMOS device is increased.

FIG. 8E illustrates an NMOS device and a PMOS device each having substrate 402a and first fin substrate 404a. The NMOS device further includes second fin substrate 406b and the PMOS device further includes second fin substrate 406a. Substrate 402 and first fin substrate 404a are each comprised of silicon, second fin substrate 406b is comprised of relaxed SiGe, and second fin substrate 406a is comprised of silicon. The NMOS device further includes epitaxial layer 408b comprised of Si and having a tensile uni-axial strain, and the PMOS device further includes epitaxial layer 408a comprised of SiGe and having a compressive uni-axial strain. Epitaxial layers 408b and 408a are formed over a top surface and sidewalls of fin substrates 406b and 406a, respectively. Strain μ(strain) in the epitaxial layer 408b of the NMOS device is increased, and both intrinsic carrier mobility μ(intrinsic) and strain μ(strain) in the epitaxial layer 408a of the PMOS device is increased.

FIG. 8F illustrates an NMOS device and a PMOS device each having substrate 402a and first fin substrate 404a. The NMOS device further includes second fin substrate 406c and the PMOS device further includes second fin substrate 406a. Substrate 402 and first fin substrate 404a are each comprised of silicon, second fin substrate 406c is comprised of relaxed Ge, and second fin substrate 406a is comprised of silicon. The NMOS device further includes epitaxial layer 408d comprised of SiGe and having a tensile uni-axial strain, and the PMOS device further includes epitaxial layer 408a comprised of SiGe and having a compressive uni-axial strain. Epitaxial layers 408d and 408a are formed over a top surface and sidewalls of fin substrates 406c and 406a, respectively. Both intrinsic carrier mobility μ(intrinsic) and strain μ(strain) in the epitaxial layer 408d of the NMOS device is increased, and both intrinsic carrier mobility μ(intrinsic) and strain μ(strain) in the epitaxial layer 408a of the PMOS device is increased.

FIG. 8G illustrates an NMOS device and a PMOS device each having substrate 402a and first fin substrate 404a. The NMOS device further includes second fin substrate 406c and the PMOS device further includes second fin substrate 406b. Substrate 402 and first fin substrate 404a are each comprised of silicon, second fin substrate 406c is comprised of relaxed Ge, and second fin substrate 406b is comprised of relaxed SiGe. The NMOS device further includes epitaxial layer 408d comprised of SiGe and having a tensile uni-axial strain, and the PMOS device further includes epitaxial layer 408c comprised of Ge and having a compressive uni-axial strain. Epitaxial layers 408d and 408c are formed over a top surface and sidewalls of fin substrates 406c and 406b, respectively. Both intrinsic carrier mobility μ(intrinsic) and strain μ(strain) in the epitaxial layer 408d of the NMOS device is increased, and both intrinsic carrier mobility μ(intrinsic) and strain μ(strain) in the epitaxial layer 408c of the PMOS device is increased.

FIG. 9A illustrates an NMOS device and a PMOS device each having substrate 402a and first fin substrate 404a. The NMOS device further includes second fin substrate 406a and the PMOS device further includes second fin substrate 406d. Substrate 402, first fin substrate 404a, and second fin substrate 406a are each comprised of silicon. Second fin substrate 406d is comprised of SiGe and has a compressive uni-axial strain. Both intrinsic carrier mobility as compared to Si (μ(intrinsic)) and strain (μ(strain)) in second fin substrate 406d of the PMOS device is increased.

FIG. 9B illustrates an NMOS device including substrate 402a, first fin substrate 404b, and second fin substrate 406a, and a PMOS device including substrate 402a, first fin substrate 404b, and second fin substrate 406b. Substrate 402a is comprised of silicon, first fin substrate 404b and second fin substrate 406b are each comprised of relaxed SiGe, and second fin substrate 406a is comprised of silicon and has a tensile uni-axial strain. Strain μ(strain) in the second fin substrate 406a of the NMOS device is increased, and intrinsic carrier mobility μ(intrinsic) in second fin substrate 406b of the PMOS device is increased.

FIG. 9C illustrates an NMOS device including substrate 402a, first fin substrate 404b, and second fin substrate 406b, and a PMOS device including substrate 402a, first fin substrate 404b, and second fin substrate 406e. Substrate 402a is comprised of silicon, first fin substrate 404b and second fin substrate 406b are each comprised of relaxed SiGe, and second fin substrate 406e is comprised of Ge and has a compressive uni-axial strain. Intrinsic carrier mobility μ(intrinsic) in the second fin substrate 406b of the NMOS device is increased, and both intrinsic carrier mobility μ(intrinsic) and strain μ(strain) in second fin substrate 406e of the PMOS device is increased.

FIG. 9D illustrates an NMOS device including substrate 402a, first fin substrate 404c, and second fin substrate 406f, and a PMOS device including substrate 402a, first fin substrate 404c, and second fin substrate 406c. Substrate 402a is comprised of silicon, first fin substrate 404c and second fin substrate 406c are each comprised of relaxed Ge, and second fin substrate 406f is comprised of SiGe and has a tensile uni-axial strain. Both intrinsic carrier mobility μ(intrinsic) and strain μ(strain) in the second fin substrate 406f of the NMOS device is increased, and intrinsic carrier mobility μ(intrinsic) in second fin substrate 406c of the PMOS device is increased.

FIG. 9E illustrates an NMOS device including substrate 402a, first fin substrate 404b, and second fin substrate 406b, and a PMOS device including substrate 402a, first fin substrate 404a, and second fin substrate 406d. Substrate 402a and first fin substrate 404a are each comprised of silicon, first fin substrate 404b and second fin substrate 406b are each comprised of relaxed SiGe, and second fin substrate 406d is comprised of SiGe and has a compressive uni-axial strain. Strain μ(strain) in the second fin substrate 406b of the NMOS device is increased, and both intrinsic carrier mobility μ(intrinsic) and strain μ(strain) in second fin substrate 406d of the PMOS device is increased.

FIG. 9F illustrates an NMOS device including substrate 402a, first fin substrate 404c, and second fin substrate 406f, and a PMOS device including substrate 402a, first fin substrate 404a, and second fin substrate 406d. Substrate 402a and first fin substrate 404a are each comprised of silicon, first fin substrate 404c is comprised of relaxed Ge, second fin substrate 406f is comprised of SiGe having a tensile uni-axial strain, and second fin substrate 406d is comprised of SiGe having a compressive uni-axial strain. Both intrinsic carrier mobility μ(intrinsic) and strain μ(strain) in the second fin substrate 406f of the NMOS device is increased, and both intrinsic carrier mobility μ(intrinsic) and strain μ(strain) in second fin substrate 406d of the PMOS device is increased.

FIG. 9G illustrates an NMOS device including substrate 402a, first fin substrate 404c, and second fin substrate 406f, and a PMOS device including substrate 402a, first fin substrate 404b, and second fin substrate 406e. Substrate 402a is comprised of silicon, first fin substrate 404c is comprised of relaxed Ge, first fin substrate 404b is comprised of relaxed SiGe, second fin substrate 406f is comprised of SiGe having a tensile uni-axial strain, and second fin substrate 406e is comprised of Ge having a compressive uni-axial strain. Both intrinsic carrier mobility μ(intrinsic) and strain μ(strain) in the second fin substrate 406f of the NMOS device is increased, and both intrinsic carrier mobility μ(intrinsic) and strain μ(strain) in second fin substrate 406e of the PMOS device is increased.

FIGS. 10A-10G illustrate the NMOS and PMOS devices of FIGS. 9A-9G, respectively, including a silicon passivation layer 409 epitaxially grown on exposed surfaces of a second fin substrate that is not comprised of silicon. Silicon passivation may improve the channel/dielectric interface by reducing the interface trap density.

FIG. 10A illustrates silicon passivation layer 409 formed over second fin substrate 406d comprised of SiGe having a compressive uni-axial strain. FIG. 10B illustrates silicon passivation layer 409 formed over second fin substrate 406b comprised of relaxed SiGe. FIG. 10C illustrates silicon passivation layer 409 formed over second fin substrate 406b comprised of relaxed SiGe and over second fin substrate 406e comprised of Ge having a compressive uni-axial strain. FIG. 10D illustrates silicon passivation layer 409 formed over second fin substrate 406f comprised of SiGe having a tensile uni-axial strain and over second fin substrate 406c comprised of relaxed Ge. FIG. 10E illustrates silicon passivation layer 409 formed over second fin substrate 406b comprised of relaxed SiGe and over second fin substrate 406d comprised of SiGe having a compressive uni-axial strain. FIG. 10F illustrates silicon passivation layer 409 formed over second fin substrate 406f comprised of SiGe having a tensile uni-axial strain and over second fin substrate 406d comprised of SiGe having a compressive uni-axial strain. FIG. 10G illustrates silicon passivation layer 409 formed over second fin substrate 406f comprised of SiGe having a tensile uni-axial strain and over second fin substrate 406e comprised of Ge having a compressive uni-axial strain.

Thus, strained SiGe, Ge, or Si channel layers (e.g., epitaxial layer 408) may be epitaxially grown on relaxed SiGe, Ge, or Si fin substrates (e.g., fin substrate 406) utilizing lattice mismatch of the channel layer material and the underlying fin substrate material. In the case of SiGe, Ge, or Si channels, materials are chosen such that the channel material will be tensile strained for the NMOS device and compressive strained for the PMOS device. It is noted that other combinations of materials for the NMOS and PMOS devices above are within the scope of the present disclosure (e.g., c-SiGe on Si for PMOS devices and t-Si on r-SiGe for NMOS devices).

Advantageously, the transistor devices and fabrication methods described above may be easily integrated with standard CMOS processes. Furthermore, the present disclosure allows for counteracting relaxation of the longitudinal stress component of the channel layer to provide high uni-axial compressive stress levels (e.g., greater than about 3GPa), which optimizes transistor performance.

Thus, the present disclosure provides for various embodiments. In one embodiment, a semiconductor device is disclosed. A semiconductor device includes a substrate including at least two isolation features, a fin substrate disposed between and above the at least two isolation features, and an epitaxial layer disposed over exposed portions of the fin substrate. According to one aspect, the epitaxial layer may be disposed over a top surface and sidewalls of the fin substrate. According to another aspect, the fin substrate may be disposed substantially completely above the at least two isolation features.

In yet another embodiment, a semiconductor device includes a substrate including at least two isolation features, a substrate buffer region disposed between the at least two isolation features, and a fin substrate disposed above the substrate buffer region, between the at least two isolation features, and at a vertical level substantially completely above the at least two isolation features. The device further includes a source/drain epitaxial layer disposed over a top surface and sidewalls of the fin substrate.

The present disclosure also provides for a method of fabricating a semiconductor device. In one embodiment, the method includes providing a substrate including at least two isolation features, forming a fin substrate between the at least two isolation features, and at a vertical level above the at least two isolation features, and forming an epitaxial layer over exposed portions of the fin substrate. According to one aspect, the epitaxial layer may be deposited over a top surface and sidewalls of the fin substrate. According to another aspect, the fin substrate may be deposited substantially completely above the at least two isolation features.

Although embodiments of the present disclosure have been described in detail, those skilled in the art should understand that they may make various changes, substitutions and alterations herein without departing from the spirit and scope of the present disclosure. For example, other materials for the substrate, fin substrate, and epitaxial layers, such as Group III-V materials, are also within the scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A semiconductor device comprising:
    a substrate;
    a fin structure disposed over the substrate, wherein a total length of the fin structure is along a first direction, a total width of the fin structure is along a second direction that is substantially perpendicular to the first direction, the total width is a channel width of a channel region of the fin structure, the total length of the fin structure is at least 100 nm, and a ratio of the total width of the fin structure to the total length of the fin structure is about 1:5 to about 1:10, and further wherein the fin structure includes:
        a first silicon epitaxial layer disposed directly on the substrate, wherein the first silicon epitaxial layer extends the total length of the fin structure,
        a silicon germanium epitaxial layer disposed directly on the first silicon epitaxial layer, wherein the silicon germanium epitaxial layer extends the total length of the fin structure and includes relaxed silicon germanium, and
        a second silicon epitaxial layer disposed directly on the silicon germanium epitaxial layer, wherein the second silicon epitaxial layer extends the total length of the fin structure, the second silicon epitaxial layer includes strained silicon, the second silicon epitaxial layer includes a longitudinal tensile stress component and a relaxed transversal stress component, the longitudinal tensile stress component is along the first direction, and the relaxed transversal stress component is along the second direction;
    a gate structure disposed on the channel region of the fin structure, such that the gate structure interposes a source region and a drain region of the fin structure, wherein the channel region, the source region, and the drain region each include the first silicon epitaxial layer, the silicon germanium epitaxial layer, and the second silicon epitaxial layer of the fin structure; and
    wherein:
        in the source region and the drain region, the silicon germanium epitaxial layer has a first sidewall, a second sidewall, a top, and a bottom configured to provide the silicon germanium epitaxial layer with a rectangular shape,
        upper portions of the first sidewall and the second sidewall of the silicon germanium epitaxial layer are completely covered and physically contacted by the second silicon epitaxial layer and lower portions of the first sidewall and the second sidewall of the silicon germanium epitaxial layer are completely covered and physically contacted by a substrate isolation structure, and
        a width of the silicon germanium epitaxial layer along the second direction is substantially uniform above a top of the substrate isolation structure and the substrate isolation structure physically contacts a top surface of the substrate.

2. The semiconductor device of claim 1, wherein the second silicon epitaxial layer exhibits uniaxial strain along a channel length of the channel region of the fin structure.

3. The semiconductor device of claim 1, wherein the total length of the fin structure is about 100 nm and the total width of the fin structure is about 10 nm.

4. The semiconductor device of claim 1, wherein:
    a total thickness of the silicon germanium epitaxial layer along a third direction is about 10 nm to about 40 nm;
    the third direction is substantially perpendicular to the first direction;
    the total thickness of the silicon germanium epitaxial layer is a sum of a thickness of the silicon germanium epitaxial layer below the substrate isolation structure along the third direction and a thickness of the silicon germanium epitaxial layer above the substrate isolation structure along the third direction; and
    the thickness of the silicon germanium epitaxial layer above the substrate isolation structure along the third direction is about 10 nm.

5. The semiconductor device of claim 1, wherein the fin structure has uniaxial stress along a direction of the total length of the fin structure.

6. The semiconductor device of claim 5, wherein the total width of the fin structure is about 10 nm to about 20 nm.

7. A semiconductor device, comprising:
    a fin structure disposed over a substrate, wherein the fin structure includes:
        a fin substrate including a relaxed semiconductor material disposed over the substrate, wherein:
            the fin substrate has a first sidewall, a second sidewall, and a top that extends from the first sidewall and the second sidewall,
            the fin substrate has a fin width along a first direction between the first sidewall and the second sidewall, the fin substrate has a fin height along a second direction, the fin substrate has a fin length along a third direction, wherein the fin length is at least five times greater than the fin width to provide a channel of the fin structure with uniaxial stress along the fin length, and an epitaxial layer including a tensile-strained semiconductor material disposed on the relaxed semiconductor material of the fin substrate, wherein the epitaxial layer includes a longitudinal tensile stress component and a relaxed transversal stress component; and a first isolation feature and a second isolation feature disposed over the substrate, wherein:

the fin substrate is disposed between the first isolation feature and the second isolation feature, the fin width of the fin substrate is substantially uniform along the fin height from the top of the fin substrate to tops of the first isolation feature and the second isolation feature, the epitaxial layer is disposed over the tops of the first isolation feature and the second isolation feature, the epitaxial layer and the first isolation feature physically contact and cover an entirety of the first sidewall of the fin substrate, and the epitaxial layer and the second isolation feature physically contact and cover an entirety of the second sidewall of the fin substrate.

8. The semiconductor device of claim 1, wherein:

each of the substrate, the fin substrate, and the epitaxial layer includes silicon, germanium, or a combination thereof; and the substrate has a first composition, the fin substrate has a second composition, and the epitaxial layer has a third composition, wherein the first composition, the second composition, and the third composition are different and a lattice mismatch exists between the fin substrate and the epitaxial layer.

9. The semiconductor device of claim 1, wherein the fin substrate has a height between the top of the fin substrate and the tops of the first isolation feature and the second isolation feature, and the height is substantially the same as the fin width from the top of the fin substrate to tops of the first isolation feature and the second isolation feature.

10. The semiconductor device of claim 7, further comprising a gate disposed over the epitaxial layer, wherein the gate is disposed on at least three surfaces of the epitaxial layer.

11. The semiconductor device of claim 7, wherein the fin length is about 100 nm to about 200 nm and the fin width is about 10 nm to about 20 nm.

12. The semiconductor device of claim 1, wherein the fin substrate includes a first portion that includes the relaxed semiconductor material and a second portion that includes a semiconductor material, wherein the first portion has a first height along the second direction that is greater than a second height of the first isolation feature and the second isolation feature along the second direction, the second portion has a third height along the second direction that is less than the second height of the first isolation feature and the second isolation feature, and a sum of the first height and the second height is the fin height.

13. The semiconductor device of claim 12, wherein the second portion is a doped portion of the substrate.

14. A semiconductor device comprising:
a substrate;
a shallow trench isolation (STI) feature;
a fin structure disposed over the substrate and extending through the STI feature, wherein the fin structure includes:

a relaxed silicon germanium epitaxial layer, a tensile-strained silicon epitaxial layer disposed on the relaxed silicon germanium epitaxial layer, wherein the tensile-strained silicon epitaxial layer exhibits relaxed strain along a width of the fin structure and tensile strain along a length of a channel region of the fin structure, wherein the fin structure extends lengthwise along a first direction, widthwise along a second direction, and height wise along a third direction, and wherein a total length of the fin structure is about 100 nm, a total width of a portion of the fin structure that is disposed above a top surface of the STI feature is about 10 nm, and a total height of the portion of the fin structure that is disposed above the top surface of the STI feature is about 10 nm;

a gate structure disposed on the channel region of the fin structure, wherein the gate structure extends lengthwise along the second direction and the gate structure interposes a source region and a drain region of the fin structure along the first direction, wherein the tensile-strained silicon epitaxial layer exhibits relaxed strain and tensile strain in the source region and the drain region of the fin structure; and wherein:

the tensile-strained silicon epitaxial layer wraps the relaxed silicon germanium epitaxial layer and physically contacts the top surface of the STI feature, wherein the tensile-strained silicon epitaxial layer physically contacts a top of the relaxed silicon germanium epitaxial layer, a first portion of a first sidewall of the relaxed silicon germanium epitaxial layer, and a first portion of a second sidewall of the relaxed silicon germanium epitaxial layer, the STI feature covers and physically contacts a second portion of the first sidewall of the relaxed silicon germanium epitaxial layer and a second portion of the second sidewall of the relaxed silicon germanium epitaxial layer, an entirety of the first sidewall of the relaxed silicon germanium epitaxial layer in the source region and the drain region is formed by the first portion of the first sidewall and the second portion of the first sidewall, an entirety of the second sidewall of the relaxed silicon germanium epitaxial layer in the source region and the drain region is formed by the first portion of the second sidewall and the second portion of the second sidewall, and a width of the relaxed silicon germanium epitaxial layer is substantially uniform along the total height from the top of the relaxed silicon germanium epitaxial layer to the top of the STI feature.

15. The semiconductor device of claim 14, wherein the tensile strain along the length of the channel region is a longitudinal uni-axial strain.

16. The semiconductor device of claim 14, wherein the first sidewall and the second sidewall of the relaxed silicon germanium epitaxial layer are straight and extend from the top of the relaxed silicon germanium epitaxial layer to a bottom of the relaxed silicon germanium epitaxial layer.

17. The semiconductor device of claim 14, wherein the relaxed silicon germanium epitaxial layer includes about 50% germanium.

18. The semiconductor device of claim 14, further comprising a silicon passivation layer disposed over the tensile-strained silicon epitaxial layer.

19. The semiconductor device of claim 14, wherein the fin structure further includes a substrate portion and the relaxed silicon germanium epitaxial layer covers and physically contacts an entirety of a top surface of the substrate portion in the source region and the drain region.

20. The semiconductor device of claim 19, wherein a height along the third direction of the relaxed silicon germanium epitaxial layer is greater than a height along the third direction of the substrate portion.

* * * * *